United States Patent [19]

Ohno et al.

[11] Patent Number: 4,713,585
[45] Date of Patent: Dec. 15, 1987

[54] ION SOURCE

[75] Inventors: Yasunori Ohno; Tomoe Kurosawa, both of Hitachi; Tadashi Sato, Mito; Yukio Kurosawa; Yoshimi Hakamata, both of Hitachi, all of Japan

[73] Assignee: Hitachi, Ltd., Tokyo, Japan

[21] Appl. No.: 911,790

[22] Filed: Sep. 26, 1986

[30] Foreign Application Priority Data

Sep. 30, 1985 [JP] Japan .................... 60-214627

[51] Int. Cl.⁴ ........................... H01J 7/24
[52] U.S. Cl. ........................ 315/111.81; 250/423 R; 250/492.3; 313/359.1; 315/111.21; 315/111.71
[58] Field of Search ............ 313/359.1, 360.1; 250/423, 492.3; 315/111.81, 111.71, 111.21, 111.31, 111.41

[56] References Cited

U.S. PATENT DOCUMENTS

| 3,230,418 | 1/1966 | Dandl | 315/111.71 |
| 4,409,520 | 10/1983 | Koike et al. | 315/111.41 |
| 4,631,438 | 12/1986 | Jacquot | 315/111.81 |
| 4,647,818 | 3/1987 | Ham | 315/111.31 |
| 4,652,795 | 3/1987 | Lee et al. | 315/111.81 |

FOREIGN PATENT DOCUMENTS 0184812 6/1986 European Pat. Off. .

OTHER PUBLICATIONS

"Energy Anomalies Observed in Ion Beam Produced by RF Sources" by C. J. Cook et al., Rev. Of Sci Inst. vol. 33, No. 6, pp. 649–652, 6/62.
"Microave Ion Source" by Sakudo et al., Rev. of Sci Inst. vol. 48, No. 7, Jul. 1977 pp. 762–766.

Primary Examiner—Harold Dixon
Attorney, Agent, or Firm—Antonelli, Terry & Wands

[57] ABSTRACT

An ion source for producing an ion beam utilized for fabrication and processing of semiconductors, thin films or the like includes a plasma producing chamber equipped with first magnetic means for limiting a plasma region and a plasma expansion chamber provided in combination with the plasma producing chamber on the side where a beam extracting electrode is disposed. The plasma expansion chamber is provided with second magnet array for confining and holding a plasma region therein which is of a larger area than that of the plasma region formed in the plasma producing chamber.

10 Claims, 13 Drawing Figures

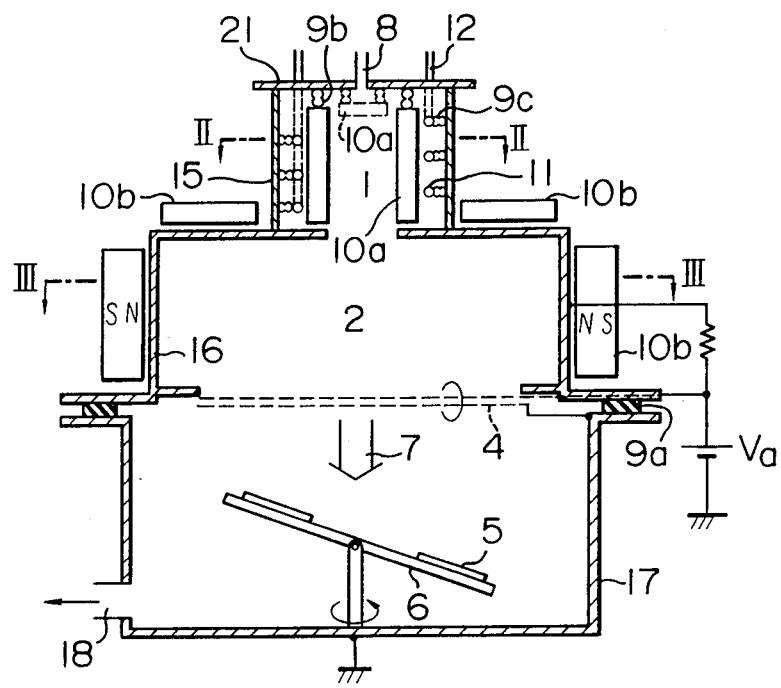
FIG. 1
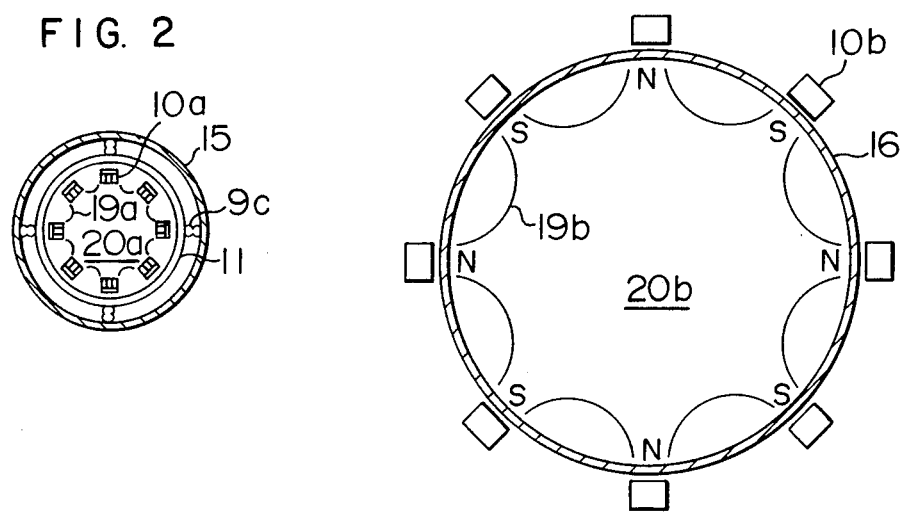
FIG. 2
FIG. 3

ION SOURCE

BACKGROUND OF THE INVENTION

The present invention generally relates to an ion source and more particularly to an ion source for producing an ion beam to be utilized in the processing as well as fabrication of semiconductors, thin films and the like.

In recent years, tendency of an ion beam being utilized in etching apparatus and sputtering apparatus for processing and manufacturing functional thin films, semiconductors and the like becomes more and more flourish in accompaniment to an increasing demand for the fineness in the implementation of these devices.

Many of the ion sources for producing the ion beam destined for the applications mentioned above are so designed that an arc discharge is sustained by emission of thermal electrons from a filament to thereby produce plasma of a desired gas. However, the conventional ion source of this type suffers a serious disadvantage that the use life of the filament is so short that frequent replacement thereof is required. This is because the plasma has to be produced from a gas which exhibits a high reactivity in such applications as etching or the like.

The problem mentioned above may be solved by resorting to adoption of a high-frequency (radio frequency or rf) discharge and a microwave discharge for producing the plasma. The ion source of this type can be operated over an extended use life because the filament is no more employed. The ion source operating based on the high-frequency discharge has long been studied and is reported, for example, in C.J. Cook et al's article "Energy Anomalies Observed in Ion Beams Produced by RF Sources" of "Rev. Sci. Instrum. 25", (1962). As discussed also in this literature, it is known that the ion beam extracted from a plasma produced through the high-frequency discharge has an energy level which is higher than the extracting potential by several hundred eV on an average (referred to as excess energy) and exhibits a considerably broad energy spread.

On the other hand, the inventors of the present application have experimentally discovered that the number of ions contained in the ion beam of an energy level not higher than 1 KeV extracted from the plasma produced through the high-frequency (rf) discharge is small when compared with that of the ion beam extracted from the plasma produced through the arc discharge or microwave discharge and having a density equivalent to that of the plasma produced by the high-frequency discharge mentioned above.

The ion sources in which the microwave is utilized are disclosed in detail, for example, in N. Sakudo et al's article "Microwave Ion Source" of "Rev. Sci. Instrum.", Vol. 48, No. 7, (July, 1977). The ion source of this type has a narrow energy spread and produces no excess energy, differing from the case of the high-frequency discharge type ion source. By virtue of these features, the microwave ion source can be advantageously used as the ion source for the ion implantation process involving mass separation. However, density distribution of the plasma produced by the microwave ion source does not always have a desired uniformity. When the ion beam of an energy level on the order of several hundred eV is extracted from the plasma produced by the microwave ion source for an etching process, the ion beam has an intensity distribution substantially proportional to the distribution of the plasma density. Accordingly, with the etching apparatus employing the ion source of the microwave discharge type, difficulty is encountered in realizing a uniform etching rate over a large area. For realizing a large-diameter beam (i.e. an ion beam having a large area), the plasma chamber may be constructed in a large size. In that case, however, it is necessary to establish the impedance matching for injection of microwave power into the plasma chamber, imposing thus restriction on the selection of dimensions of a waveguide as well as the plasma chamber. Further, in practical applications, restriction is also imposed on the size of a cylindrical coil for generating a magnetic field.

SUMMARY OF THE INVENTION

In the light of the state of the art described above, it is an object of the present invention to provide an ion source which makes available an ion beam of a large area without increasing the volume of a plasma producing chamber.

In view of the above object, it is provided according to a general aspect of the invention an ion source which comprises a plasma producing chamber having an inner cavity supplied with a gas for producing a plasma through high-frequency discharge or microwave discharge and provided with first magnetic means for restricting a plasma region, and a plasma expansion chamber provided on the side of the plasma producing chamber where ion beam extracting means is disposed, wherein the plasma expansion chamber is equipped with second magnetic means for confining and holding a plasma region of a larger area than that of the plasma region within the plasma producing chamber.

The above and other objects, features and advantages of the present invention will be more apparent upon reading the following description of the preferred embodiments thereof taken in conjunction with the accompanying drawings.

BRIEF DESCRIPTION OF THE DRAWINGS

FIG. 1 is a vertical sectional view showing an exemplary embodiment of the ion source according to the present invention.

FIG. 2 is a sectional view taken along the line II—II in FIG. 1.

FIG. 3 is a sectional view taken along the line III-—III in FIG. 1.

DESCRIPTION OF THE PREFERRED EMBODIMENTS

Figure 4:
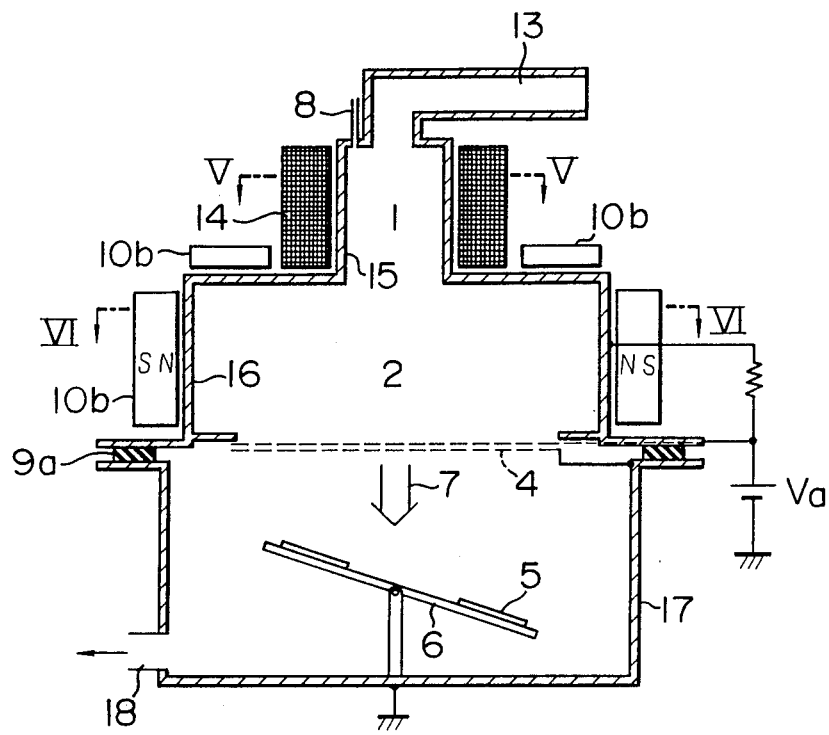
FIG. 4 is a vertical sectional view showing another embodiment of the ion source according to the invention.

Now, the present invention will be described in detail with reference to the drawings.

Referring to FIG. 1 which shows in a vertical sectional view an exemplary embodiment of the ion source according to the invention, a plasma producing chamber generally denoted by a reference numeral 1 is composed of a cylindrical side wall 15 and a back plate 21 closing hermetically the top end of the cylindrical side wall 15. In the case of this illustrative embodiment, the plasma producing chamber 1 is provided with a plasma expansion chamber 2 at the bottom side. More specifically, the plasma expansion chamber 2 has a top end coupled to the plasma producing chamber 1 and includes an enlarged cylindrical side wall 16 and a beam extracting electrode 4. A vacuum container 17 is connected to the plasma expansion chamber 2 at the bottom end thereof through an interposed insulation member 9a. There is disposed within the vacuum chamber 17 a holder 6 mounted rotatably while being cooled by water. A workpiece 5 to be processed is disposed on the holder 6. The whole assembly comprising the plasma producing chamber, the plasma expansion chamber and the vacuum container are evacuated through an evacuation outlet 18 so that vacuum prevails within the whole system.

Referring to FIG. 2 together with FIG. 1, there are disposed within the plasma producing chamber 2 a plurality of permanent magnets 10a fixedly mounted on the back plate 21 with insulations 9b interposed therebetween in a ring-like array so as to generate a magnetic field 19a of multicusp geometry which defines a plasma region 20. Disposed behind and around the permanent magnet array 10a is a high-frequency coil 11 of three turns fixedly supported by means of insulation members 9c within the plasma producing chamber 1. A high-frequency power is supplied through a feed-in terminal 12 which hermetically extends through the back plate 21, being electrically insulated therefrom. Further, a gas inlet port 8 is provided in the back plate 21 for charging a gas into the plasma producing chamber 1.

Referring to FIG. 3, a plurality of permanent magnets 10b are disposed around the outer periphery of the side wall 16 of the plasma expansion chamber 2 for generating a magnetic field 19b of multicusp geometry defining a plasma region 20b which is apparently of a larger area than the plasma region 20a shown in FIG. 2.

Now, operation of the ion source of the structure described above will be described.

After the plasma producing chamber 1 is evacuated to a vacuum of ca. $5 \times 10^{-6}$ Torr, a reactive gas is supplied to the plasma producing chamber 1 through the inlet port 8 to thereby produce a vacuum of $1 \times 10^{-4}$ Torr within the vacuum container 17. Subsequently, a high-frequency power of 13.56 MHz is applied to the high-frequency coil 11 to cause electric discharge to occur across a discharge gap (not shown) disposed within the plasma producing chamber 1, as the result of which a plasma of the loaded restrictive gas is produced within the plasma chamber 1. Once the plasma has been stabilized, it is no more necessary to sustain the electric discharge at the discharge gap. The plasma produced in this manner tends to diffuse toward the side wall 15 of the plasma producing chamber 1. In spite of this tendency, the plasma is confined within the plasma region 20a located around the center of the plasma producing chamber 1 under the influence of the magnetic field 19 of multicusp geometry generated by the permanent magnets 10a. In this manner, plasma of a high density can be produced without giving rise to dielectric breakdown in the high-frequency coil 11. In an experiment conducted by the inventors in which $O_2$-gas plasma was produced by using the apparatus shown in FIG. 1, it has been demonstrated that ion density of the plasma was about $1 \times 10^{11}$ (cm$^{-3}$). The current density of the ion beam extracted at 500 eV directly from the plasma was 0.65 mA/cm$^2$. This value of the ion current density is approximately equal to that of the ion source in which the arc discharge is utilized. However, it should be noted that the ion density in the plasma itself produced by the apparatus described above amounts to about three times as high as that attained with the arc discharge type ion source. In this conjunction, the reason why the ion beam of a high current density can not be extracted in the case of the high-frequency discharge type ion source in spite of the fact that the plasma of high ion density can be produced may be explained as follows.

Figure 11:
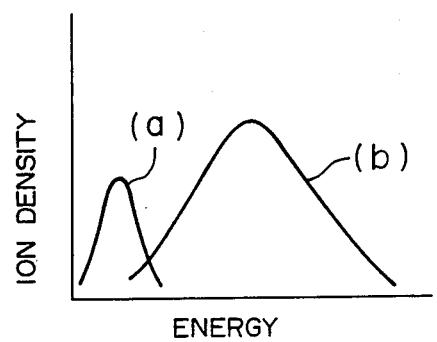
FIG. 11 is a view for graphically illustrating energy versus ion number (ion density) characteristic.

Referring to FIG. 11 which graphically shows the number of ions per unit area within the plasma producing chamber 1, ions have high energy on an average, and energy spread amounts to several hundred eV, as will be seen from a curve (a). In this connection, it is noted that when ions having relatively low energy of ca. 500 to 800 eV is extracted, those ions having energy higher than a certain level remain not extracted.

To deal with the above problem, the present invention teaches the provision of the plasma expansion chamber 2 below the plasma producing chamber 1. In the case of the instant embodiment, the plasma expansion chamber 2 has a volume which is five times as large as that of the plasma producing chamber 1. The plasma explansion chamber 2 is effective to expand the plasma produced in the chamber 1 and having a tendency of diffusion. Namely, with this arrangement, the plasma produced in the plasma source chamber 1 rapidly diffuses into the plasma expansion chamber 2, bringing about such a plasma ion energy distribution as represented by a curve (b) shown in FIG. 11. It will be seen that both the average energy level and the energy spread are significantly reduced as compared to those represented by the curve (a).

This effect can be easily understood when considering by analogy with adiabatic expansion of a gas. In reality, the plasma ion density within the plasma expansion chamber 2 is reduced by a factor of $\frac{1}{5}$ as compared with that achieved with the conventional ion source. However, the number of high energy ions which can not be extracted is also decreased. As a result, energy of the extracted ion beam 7 is about twice as high as that of the beam which can be extracted from the ion source incorporating no plasma expansion chamber. It should further be mentioned that in the plasma expansion chamber 2, plasma is confined by the magnetic field 19b of multicusp geometry generated by the permanent magnets 10b, as a result of which dissipation of plasma ions at the side wall of the plasma expansion chamber 2 is as low as 5 to 10% of the amount of plasma ions diffusing into the expansion chamber 2 from the source chamber 1.

As will now be appreciated, with the arrangement of the embodiment described above in which energy of plasma ions produced by high-frequency discharge is caused to lower in the plasma expansion chamber, those high energy plasma ions produced in the plasma source chamber which could not otherwise be extracted can now be extracted through the plasma expansion chamber 2, whereby the ion beam of an increased area can be made available with an enhanced efficiency.

Figure 5:
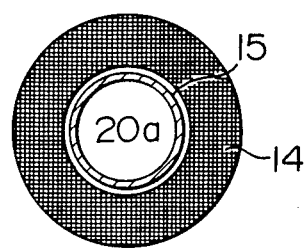
FIG. 5 is a sectional view taken along the line V—V in FIG. 4.
Figure 6:
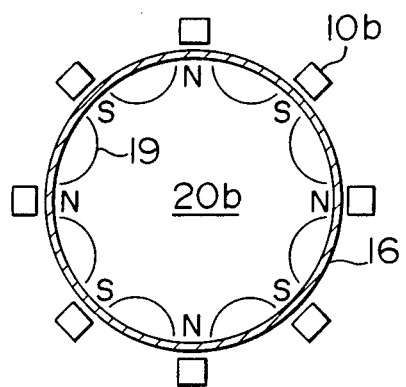
FIG. 6 is a sectional view taken along the line VI—VI in FIG. 4.
Figure 12:
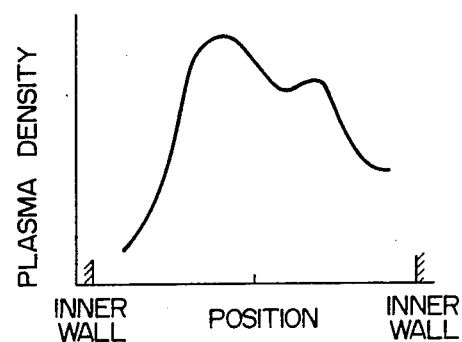
FIGS. 12 and 13 are views for graphically illustrating plasma density distributions.
Figure 13:
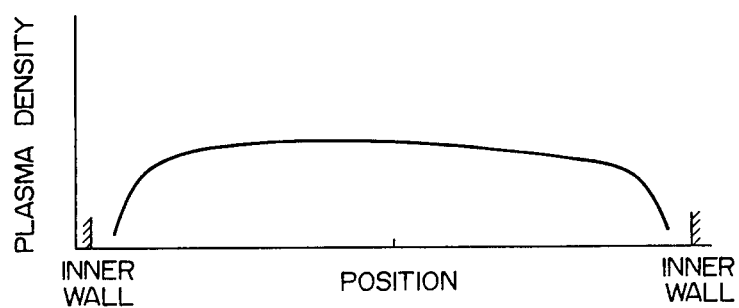

FIGS. 4, 5 and 6 show an ion source according to another embodiment of the present invention, respectively. The ion source according to the instant embodiment differs from that of the preceding embodiment in respect to the structure of the plasma producing chamber 1. More specifically, a cylindrical coil 14 is disposed around the outer periphery of the side wall 15 of the plasma producing chamber 15 to apply a DC magnetic field in the longitudinal direction of the cylindrical coil 14.

as in the case of the preceding embodiment, a reactive gas is introduced into the plasma producing or source chamber 1 after evacuation thereof through the inlet port 8, while a microwave power having a frequency of 2.45 GHz is injected through a waveguide 13. Intensity of the magnetic field as applied is so set that electron cyclotron resonance (ECR) frequency is approximately equal to that of the injected microwave power. Alternatively, the intensity of applied magnetic field may be set higher than the latter in some degree. Under the action of resonance taking place between plasma and the microwave power, the gas as introduced is ionized to form a plasma of a high density. By way of example, in the case where the oxygen gas ($O_2$) was employed, plasma density of $0.5 \times 10^{12}$ to $1 \times 10^{12}$ ($cm^{-3}$) could be realized. However, the uniformity in the plasma density distribution was rather unsatisfactory, as will be seen from FIG. 12. When the ion beam is extracted directly from the plasma producing chamber 1, the intensity distribution of the extracted ion beam becomes non-uniform. To deal with this problem, the invention teaches the provision of the plasma expansion chamber 2 in the same arrangement as in the case of the preceding embodiment shown in FIG. 1. With this structure, the distribution of the plasma density within the plasma expansion chamber 2 which is equiped with permanent magnets 10b for confining and holding plasmas can be significantly uniformed through diffusion of the plasma, as will be seen in FIG. 13, as the result of which the intensity distribution of the ion beam extracted from the plasma expansion chamber 2 becomes more uniform over a large area. Parenthetically, loss of plasma in the plasma expansion chamber 2 is as low as negligible for the same reason as in the case of the preceding embodiment.

As will now be appreciated, the structure of the ion source shown in FIGS. 3, 4 and 5 also allows an ion beam to be extracted with a uniform intensity over an increased area by virtue of the such arrangement that the density distribution of plasma produced in the plasma source chamber 1 is uniformed by providing the plasma expansion chamber 2.

Referring to FIG. 6, the magnetic field 19 of multicusp geometry is formed by the permanent magnets 10b as in the case of the preceding embodiment. It should however be mentioned that a cylindrical coil may be employed when the diameter of the plasma expansion chamber 2 is small in either embodiment. Accordingly, it is safe to say that the provision of magnetic means capable of keeping plasma off from the side wall 16 of the plasma expansion chamber 2 is sufficient.

Figure 7:
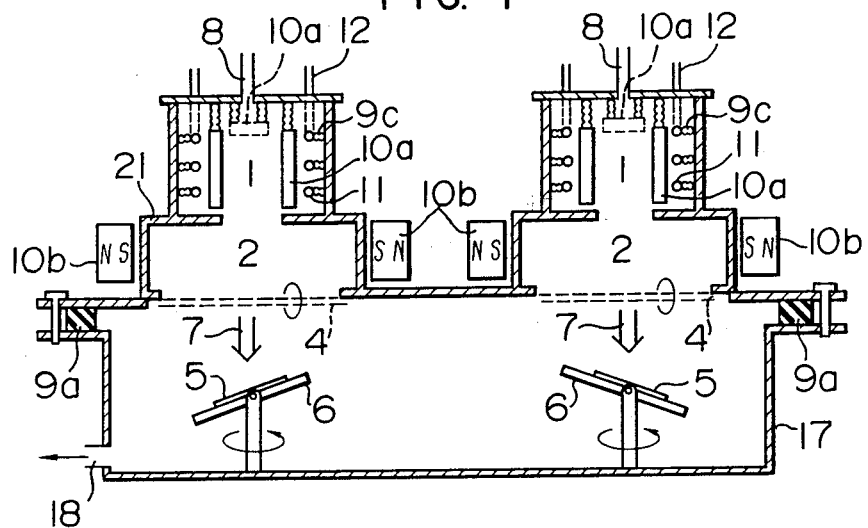
FIG. 7 is a vertical sectional view showing still another embodiment of the ion source according to the invention.
Figure 8:
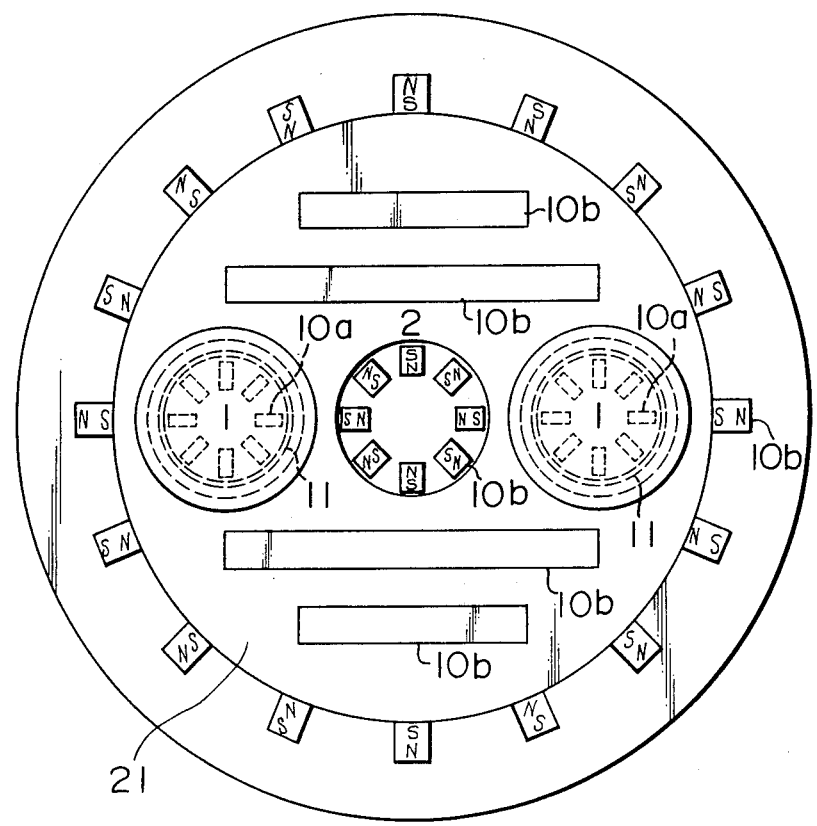
FIG. 8 is a plan view of the ion source shown in FIG. 7.

FIGS. 7 and 8 show a further embodiment of the ion source according to the invention which is designed to extract the ion beam having a further enlarged area produced through a high-frequency discharge. As will be seen in FIG. 8, the cylindrical plasma expansion chamber 2 of doughnut-like configuration having a larger plasma region than that of the plasma producing chamber 1 includes a number of permanent magnets 10b disposed around the outer and inner peripheries of the side wall 16, respectively, for producing a magnetic field of multicusp geometry. A pair of plasma producing chambers 1 which have permanent magnets 10a so as to generate a multicusp field and a high-frequency coil 11 for producing and holding plasmas are disposed on the plasma expansion chamber 2 at locations substantially symmetrical to each other. Plasma of doughnut-like geometry is produced by the pair of plasma producing chambers 1 through the mechanism described hereinbefore in conjunction with the embodiment shown in FIG. 1. By applying a predetermined potential on the ion beam extracting electrode 4, a hollow ion beam 7 can be extracted from the plasma.

In an experiment conducted by the inventors, it has been demonstrated that the ion beam having a diameter of about 800 mm could be extracted to etch at one time 16 workpieces each of 4 inches in diameter. Although the pair of plasma producing chambers 1 are assumed to be used in the case of the instant embodiment, the number of this chamber can naturally be increased to enhance the uniformity of distribution of the plasma density with the plasma expansion chamber 2.

Figure 9:
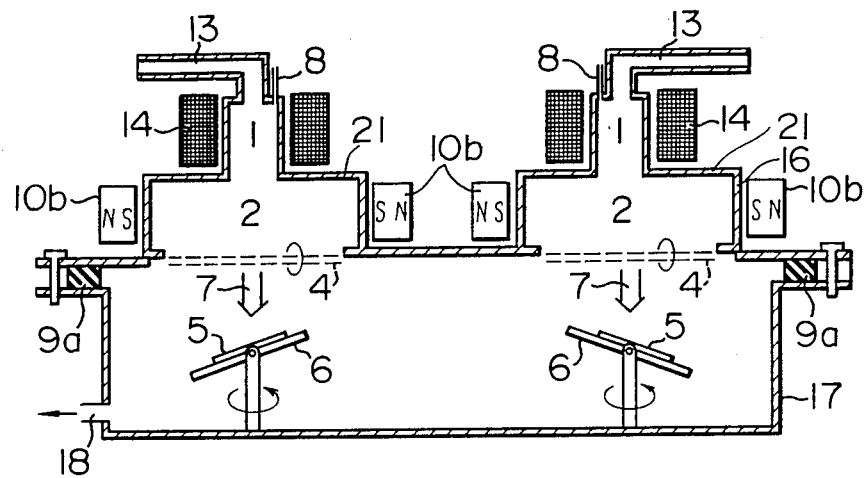
FIG. 9 is a vertical sectional view showing a further embodiment of the ion source according to the present invention.
Figure 10:
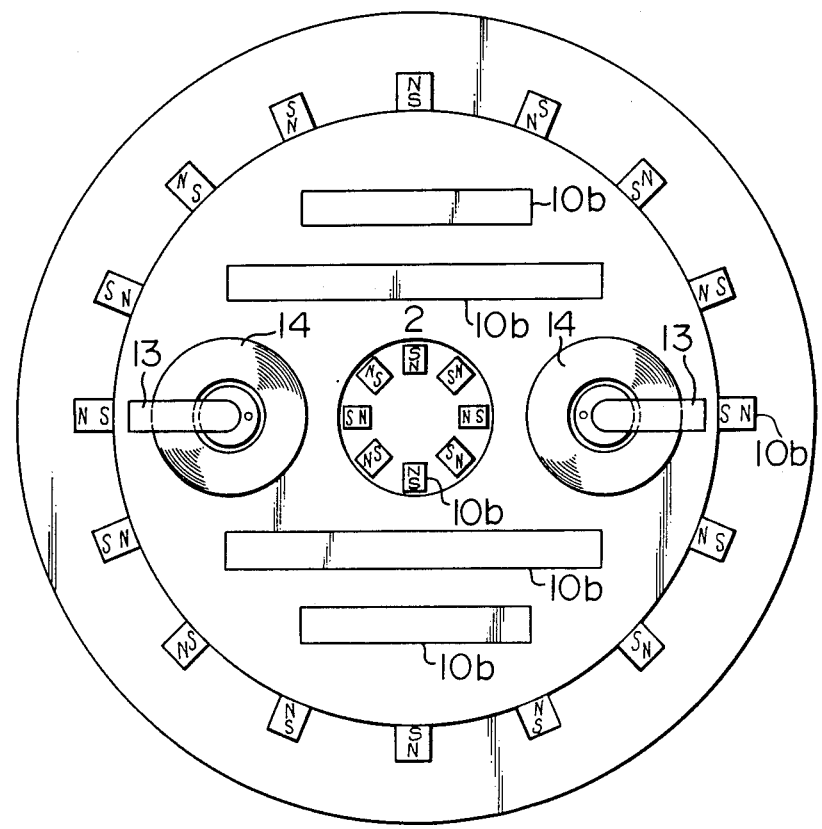
FIG. 10 is a plan view of the ion source shown in FIG. 9.

FIGS. 9 and 10 show a further embodiment of the ion source according to the present invention. This embodiment is essentially same as the ion source shown in FIGS. 7 and 8 except that the concept of plasma generation by microwave discharge is adopted. Accordingly, further detailed description of the structure shown in FIGS. 9 and 10 is omitted with same reference characters being attached to like or equivalent components.

In the case of this embodiment, the plasma expansion chamber 2 is realized in doughnut-like cylindrical configuration for increasing the area of the plasma region. To this end, a number of permanent magnets 10b are fixed on both the side walls and the top plate 21 of the plasma expansion chamber 2, as is illustrated. A pair of plasma producing chambers 1 are mounted on the plasma expansion chamber 2 at locations substantially symmetrical to each other.

With the structure of the ion source shown in FIGS. 9 and 10, an ion beam of an increased area can be extracted with a uniform distribution of intensity.

Although it has been assumed that a reactive gas is employed in the foregoing description of the various embodiments, it should be understood that inactive gases may be used, to similar effects.

As will now be appreciated, the invention which teaches that a plasma expansion chamber equipped with magnetic means for keeping off plasma from the expansion chamber wall be provided in combination with the plasma producing chamber on the side where the ion beam is extracted allows an ion beam of a large area to be extracted with high efficiency by decreasing ion energy in a high-frequency type plasma ion course, while allowing an ion beam of a large area and having a uniformed intensity to be extracted in the case of a microwave discharge type ion source.

What is claimed is:

1. An ion source, comprising a plasma producing chamber supplied with a gas for producing a plasma through high-frequency electric discharge, first magnetic means provided within said plasma producing chamber for limiting a plasma region defined within said plasma producing chamber, beam extracting means for extracting an ion beam from said plasma producing chamber, a plasma expansion chamber provided in such a manner that said plasma producing chamber is across the plasma expansion chamber from said beam extracting means, and second magnetic means for confining and holding a plasma region having an area larger than that of the plasma region formed within said plasma producing chamber.

2. An ion source according to claim 1, wherein said high-frequency electric discharge is produced by supplying a high-frequency power to a high frequency coil installed within said plasma producing chamber outside of said plasma region.

3. An ion source according to claim 1, wherein the ion source comprises a plurality of said plasma producing chambers, each of which is provided with said plasma expansion chamber.

4. An ion source according to claim 3, wherein said high-frequency electric discharge is produced by supplying a high-frequency power to a high frequency coil installed within said plasma producing chamber outside of said plasma region.

5. An ion source according to claim 3, wherein a vacuum container is disposed below each of said plasma expansion chambers, said vacuum container including a rotatable holder for mounting thereon a workpiece to be processed by the ion beam extracted through said beam extracting means.

6. An ion source according to claim 1, wherein the ion source further comprises a vacuum container disposed below said plasma expansion chamber, said vacuum container including a rotatable holder for mounting thereon a workpiece to be processed by the ion beam extracted through said beam extracting means.

7. An ion source according to claim 6, wherein the ion source comprises a plurality of said plasma producing chambers, each of which is provided with said plasma expansion chamber.

8. An ion source according to claim 7, wherein a vacuum container is disposed below each of said plasma expansion chambers, said vacuum container including a rotatable holder for mounting thereon a workpiece to be processed by the ion beam extracted through said beam extracting means.

9. An ion source comprising a plasma producing chamber supplied with a gas for producing a plasma through microwave electric discharge, first magnetic means provided in combination with said plasma producing chamber for limiting a plasma region defined within said plasma producing chamber, beam extracting means for extracting an ion beam from said plasma producing chamber, a plasma expansion chamber provided in such a manner that said plasma producing chamber is across the plasma expansion chamber from said beam extracting means, and second magnetic means for confining and holding a plasma region having an area larger than that of the plasma region formed within said plasma producing chamber.

10. An ion source according to claim 9, wherein the ion source further comprises a vacuum container disposed below said plasma expansion chamber, said vacuum container including a rotatable holder for mounting thereon a workpiece to be processed by the ion beam extracted through said beam extracting means.

* * * * *